(12) United States Patent
Grazioli et al.

(10) Patent No.: US 10,627,447 B2
(45) Date of Patent: Apr. 21, 2020

(54) SWITCH FAILURE DETECTION SYSTEM

(71) Applicants: TE CONNECTIVITY CORPORATION, Berwyn, PA (US); TE CONNECTIVITY GERMANY GMBH, Bensheim (DE); TE CONNECTIVITY SOLUTIONS GMBH, Steinach (CH)

(72) Inventors: Marco Grazioli, Zurich (CH); Robert Joseph Baragona, Hummelstown, PA (US); Frank Liebusch, Petershagen (DE); Raymond Howard Kohler, Souderton, PA (US); Ganesh Shivaram Bhatt, Dallastown, PA (US)

(73) Assignees: TE CONNECTIVIY CORPORATION, Berwyn, PA (US); TE CONNECTIVITY GERMANY GmbH, Bensheim (DE); TE CONNECTIVITY SOLUTIONS GmbH, Steinach (CH)

(*) Notice: Subject to any disclaimer, the term of this patent is extended or adjusted under 35 U.S.C. 154(b) by 345 days.

(21) Appl. No.: 15/723,842

(22) Filed: Oct. 3, 2017

(65) Prior Publication Data
US 2019/0101593 A1    Apr. 4, 2019

(51) Int. Cl.
*G01R 31/327*    (2006.01)

(52) U.S. Cl.
CPC ....... *G01R 31/3278* (2013.01); *G01R 31/327* (2013.01); *G01R 31/3275* (2013.01); *G01R 31/3277* (2013.01)

(58) Field of Classification Search
CPC .......................... G01R 31/3278; G01R 31/327
See application file for complete search history.

(56) References Cited

U.S. PATENT DOCUMENTS 3,414,776 A    12/1968    Draayer
3,560,664 A    2/1971    Stich
(Continued)

FOREIGN PATENT DOCUMENTS

| CA | 2093064 A | 3/1993 |
| EP | 0573771 A1 | 4/1993 |
| JP | S59 3270 A | 1/1984 |

OTHER PUBLICATIONS

European Search Report, dated Feb. 1, 2019, EP 18 19 8010, Application No. 18198010.3-1022.

*Primary Examiner* — Tung X Nguyen

(57) ABSTRACT

A system and method of determining a fault in two or more series switches of an electrical system. The electrical system includes, at least one AC power source, at least one sensor, at least two series switches, and a fault analysis module including a processor and a memory. The method includes applying, by the at least one AC power source, at least one time varying signal to the electrical system. The method further includes receiving, by the fault analysis module, at least one measurement, from the at least one sensor, of the at least one time varying signal, at least one node of the electrical system. The method further includes receiving, by the fault analysis module, at least one predetermined signal parameter and determining, by the fault analysis module, the presence of a fault, based on the at least one measurement and the at least one predetermined signal parameter.

18 Claims, 5 Drawing Sheets

(56) References Cited

U.S. PATENT DOCUMENTS

| | | | |
|---|---|---|---|
| 3,775,573 | A | 11/1973 | Gaon |
| 4,929,932 | A | 5/1990 | Shipkowski |
| 4,977,478 | A | 12/1990 | Powell |
| 5,096,147 | A | 3/1992 | Brohm et al. |
| 5,277,244 | A | 1/1994 | Mehta |
| 5,604,656 | A | 2/1997 | Derrick et al. |
| 5,742,513 | A | 4/1998 | Bouhenguel et al. |
| 6,188,225 | B1 | 2/2001 | Tislaric |
| 6,680,589 | B2 | 1/2004 | Neranjan et al. |
| 8,624,601 | B2 | 1/2014 | Kimes et al. |
| 2006/0212745 | A1 | 9/2006 | Zansky et al. |
| 2008/0089000 | A1 | 4/2008 | Drake et al. |
| 2011/0058296 | A1* | 3/2011 | Orchowski ........... H05B 39/044 361/88 |
| 2012/0182024 | A1* | 7/2012 | Ike ....................... G01R 31/025 324/509 |
| 2014/0002093 | A1 | 1/2014 | Elliott et al. |
| 2015/0137819 | A1 | 5/2015 | Giordano et al. |

* cited by examiner

| Relay1 | Relay2 | Vsource [V] | Vload [V] | VLoad % | Ctot [nF] |
|--------|--------|-------------|-----------|---------|-----------|
| Closed | Open   | 18.4        | 5.8       | 31%     | 2         |
| Open   | Closed | 20          | 3.6       | 18%     | 1         |
| Open   | Open   | 20.4        | 2.6       | 13%     | 0.67      |
| Closed | Closed | 10.8        | 10.8      | 100%    | 0         |

SWITCH FAILURE DETECTION SYSTEM

FIELD OF THE INVENTION

The present invention is directed to the detection and identification of failed switches in electrical systems. More particularly, the present invention is directed to series switch failure detection and identification.

BACKGROUND OF THE INVENTION

Electrical systems typically employ multiple switches and relays to activate and/or deactivate various system components during operation. The failure of one switch may cause the entire system to be taken out of service until the failed switch is identified and replaced. Conventional processes for the identification of failed switches typically involve testing the operation of each switch individually by a technician. Individual testing may be extremely time consuming and result in the electrical system being out of service for an extended period of time.

BRIEF DESCRIPTION OF THE INVENTION

In an embodiment, a method of determining a fault in two or more series switches of an electrical system. The electrical system includes, at least one AC power source, at least one sensor, at least two series switches, and a fault analysis module including a processor and a memory. The method includes applying, by the at least one AC power source, at least one time varying signal to the electrical system. The method further includes receiving, by the fault analysis module, at least one measurement, from the at least one sensor, of the at least one time varying signal, at least one node of the electrical system. The method further includes receiving, by the fault analysis module, at least one predetermined signal parameter and determining, by the fault analysis module, the presence of a fault, based on the at least one measurement and the at least one predetermined signal parameter.

Other features and advantages of the present invention will be apparent from the following more detailed description, taken in conjunction with the accompanying drawings which illustrate, by way of example, the principles of the invention.

BRIEF DESCRIPTION OF THE DRAWINGS

Wherever possible, the same reference numbers will be used throughout the drawings to represent the same parts.

DETAILED DESCRIPTION OF THE INVENTION

Provided is a switch failure detection system capable of identifying a failed switch in an electrical system. Embodiments of the present disclosure, for example, in comparison to concepts failing to include one or more of the features disclosed herein, provide a switch failure detection system capable of analyzing the impedance of an electrical system to isolate a failed switch.

Figure 1:
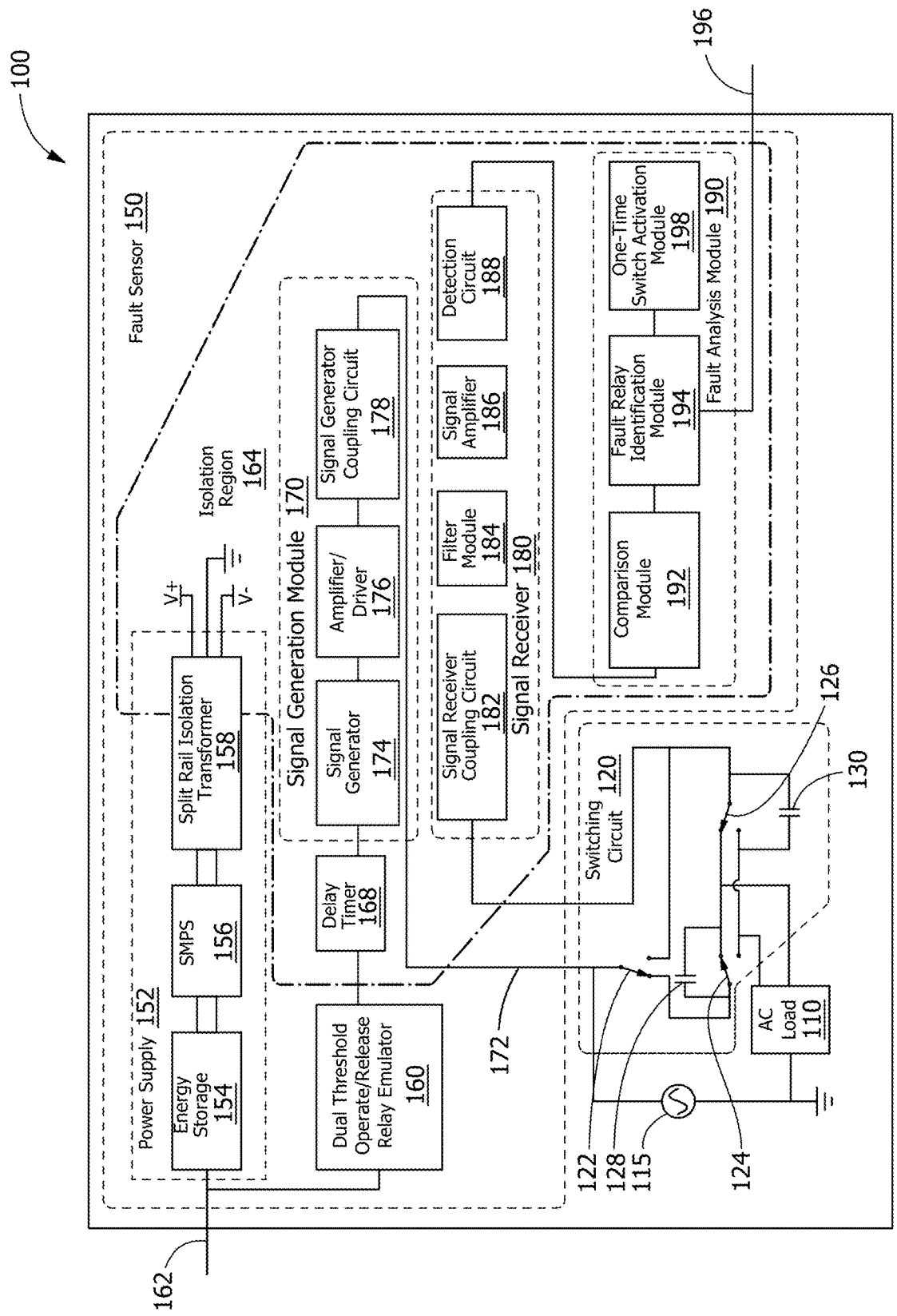
FIG. 1 is a block diagram of an electrical system including a series switch failure detection system, according to an embodiment.

A block diagram of an electrical system 100 is shown in FIG. 1. In the embodiment of FIG. 1, a load 110 having a power source 115 (e.g., 50-60 Hz AC) selectively communicatively connected thereto via a switching circuit 120 including at least two series switches. The switching circuit 120 may include at least one one-time switch 122 configured to selectively connect a circuit to the load 110 including at least one primary switch 124 and/or at least one secondary switch 126. In some embodiments, the at least two series switches includes the at least one primary switch 124 and/or at least one secondary switch 126. In some embodiments, the at least two series switches includes the at least one primary switch 124. In some embodiments, the secondary switch 126 may be configured to selectively connect the power source 115 to the load 110 via a pathway separate from the primary switch 124. In some embodiments, the at least one one-time switch 122 selectively connects a circuit to the load 110 which does not include the primary switch 124. In one embodiment, the at least one one-time switch 122 selectively connects the circuit to the load 110 which includes the secondary switch 126 and does not include the primary switch 124. In one embodiment, the at least one one-time switch 122 selectively connects the circuit to the load 110 which includes the secondary switch 126 and does not include the primary switch 124, after the primary switch 124 has failed. In an embodiment, the circuit to the load 110 may include the secondary switch 126 and be configured to allow the operation of the electrical system 100 until the primary switch 124 is repaired and/or replaced. In some embodiments, a primary switch capacitor 128 may be included in parallel with the primary switch 124. In some embodiments, a secondary switch capacitor 130 may be included in parallel with the secondary switch 126.

In the embodiment of FIG. 1, a fault sensor 150 may be connected to the switching circuit 120 in parallel with the at least two series switches. The fault sensor 150 includes a power supply 152 which further includes an energy storage unit 154 (e.g., battery, fuel cell, and/or capacitor), a switched mode power supply 156 (SMPS), and a split rail isolation transformer 158. A dual threshold operate/release relay emulator 160 triggers the fault sensor 150 to begin a test sequence to determine whether the switching circuit 120 is operating properly. In some embodiments, the fault sensor 150 may receive an external coil input signal 162 which may cause the dual threshold operate/release relay emulator 160 to begin the test sequence.

The fault sensor 150 further includes an isolation region 164 which is configured to shield the components therein from spurious signals that could affect the accuracy of the measurements conducted by the fault sensor 150 during the test sequence. In some embodiments, the activation of the at least one primary switch 124 may initiate the test sequence.

A delay timer 168 is also activated during the test sequence. The delay timer 168 delays further implementation of the test sequence for a predetermined length of time allowing the at least one primary switch 124 to close. Following the delay period a test signal 172 is applied to the load 110 by a test signal generation module 170 via a circuit including the primary switch 124. The signal generation module 170 may include a signal generator 174. An amplifier/driver 176 boosts the power of the test signal 172 and applies the test signal 172 via a signal generator coupling circuit 178 to the load 110 and switching circuit 120. In some embodiments, the amplifier/driver 176 may include a push-pull amplifier. In some embodiments, the signal generator coupling circuit 178 may include a voltage follower. In some embodiments, the test signal exhibits a frequency of at least about 1 kilohertz (1 kHz), at least about 10 kilohertz (10 kHz), at least about 100 kilohertz (100 kHz), at least about 300 kilohertz (300 kHz), at least about 500 kilohertz (500 kHz), less than about 100 megahertz (100 MHz), less than about 10 megahertz (10 MHz), less than about 1 megahertz (1 MHz), and combinations thereof.

The test signal 172 may be detected by a signal receiver module 180 of the fault sensor 150. The signal receiver module 180 may include a signal receiver coupling circuit 182, a filter module 184 which may be configured to remove spurious signals (e.g., line noise), a signal amplifier 186, and a detection circuit 188 (e.g., amplitude detection, phase angle detection, and combinations thereof). In some embodiments, the signal receiver coupling circuit 182 may including a voltage follower. In some embodiments, the signal amplifier 186 may include a push-pull amplifier.

A fault analysis module 190 receives and analyzes the test signal 172 amplitude and/or phase angle measured by the detection circuit 188. The fault analysis module 190 may include a processor and a memory containing instructions that when executed by the processor cause the fault analysis module 190 to analyze the test signal 172 and notify a user if a fault is detected. A comparison module 192 compares the test signal 172 to predetermined signal parameters corresponding to the position of the at least one primary switch 124. A fault relay identification module 194 analyzes the test signal 172 opposite the predetermined signal parameters and determines if the at least one primary switch 124 has failed. If a plurality of the at least one primary switches 124 are present, the fault relay identification module 194 may further determine which of the at least one primary switches 124 has failed.

If the fault analysis module 190 determines at least one of the at least one primary switches has failed the fault analysis module 190 may generate a relay fault signal 196. The relay fault signal 196 may be connected to a means (e.g., display, computer, wireless device (e.g., cellphone, tablet, laptop)) to notify a user of the fault. The fault analysis module 190 may additionally cause a one-time switch activation module 198 to activate the at least one one-time switch 122 to select an alternative circuit pathway. In some embodiments, the alternative circuit pathway includes the at least one secondary switch 126.

Figures 2, 3:
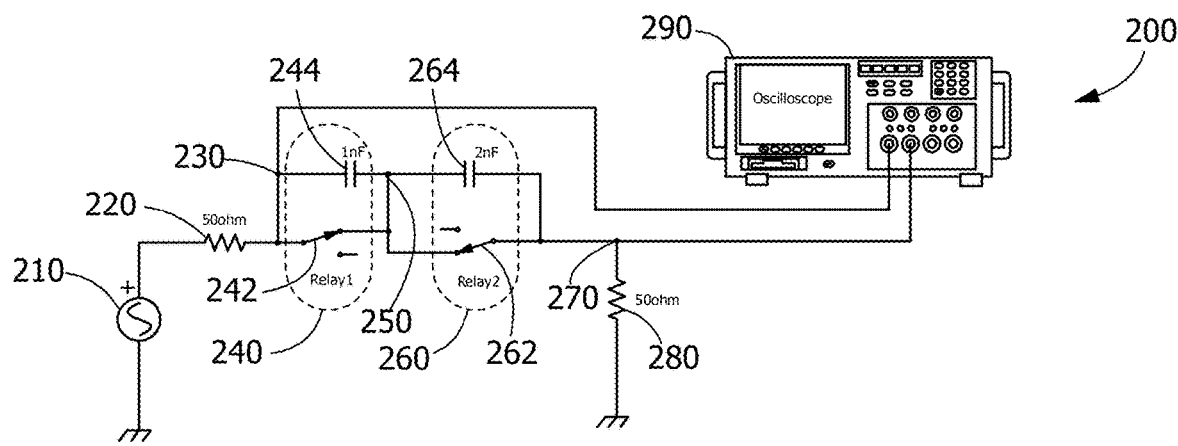
FIG. 2 is a schematic of an exemplary circuit, according to an embodiment.
FIG. 3 is a data table of measured characteristics of the circuit of FIG. 2, according to an embodiment.

FIG. 2 is a schematic diagram of an example circuit 200 illustrative of series switch fault detection. In the example of FIG. 2, the circuit 200 includes a grounded AC power source 210 in series with a first resistor 220. A node 230 is electrically connected in series with the first resistor 220. A first series switch 240 is electrically connected in series with the node 230. The first series switch 240 includes a first relay 242 in parallel with a first capacitor 244. A node 250 is further electrically connected in series with the first series switch 240. A second series switch 260 is electrically connected in series with the node 250. The second series switch 260 includes, a second relay 262 in parallel with a second capacitor 264. A node 270 is further electrically connected in series with the second series switch 260. A second resistor 280 is further electrically connected to the node 270. A sensor 290 (e.g., an oscilloscope) is electrically connected to the circuit 200 and configured to measure a voltage at node 230 and at node 270. In some embodiments, a capacitance of the first capacitor 244 and a capacitance of the second capacitor 264 are different.

FIG. 3 is a data table 300 illustrating the voltages measured by the sensor 290 at node 230 and at node 270 for each of the position combinations of the first relay 242 and the second relay 262. As seen in the data of FIG. 3, each switch combination results in a unique combination of voltages measured by the sensor 290. The uniqueness of the data resulting from the relay positions allows a user to determine to position of the relays 242, 262 based on the data. The determination of the position of the relays 242, 262 may also be automated, such as by employing the fault analysis module 190 as described in FIG. 1.

For example, if it is desired that both relays 242, 262 be closed. The data collected by the sensor 290 may be analyzed by the fault analysis module 190 to determine which relay or relays have failed (i.e. are open). The fault analysis module 190 may then generate a relay fault signal 196 to notify a user that a relay has failed.

Figure 4:
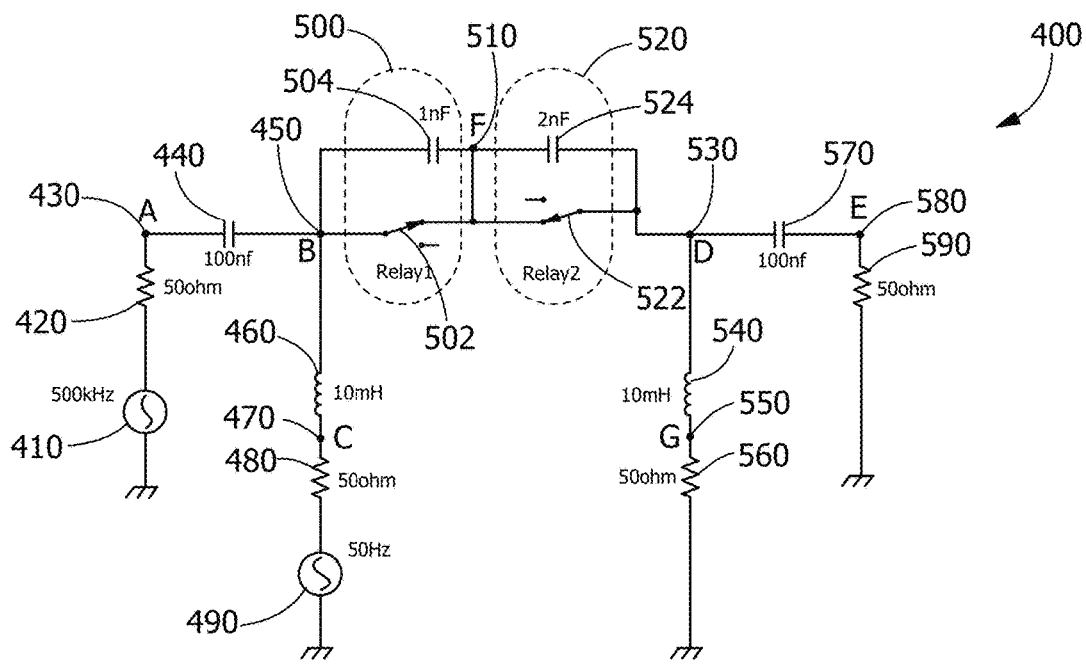
FIG. 4 is a schematic of an exemplary circuit, according to an embodiment.

FIG. 4 is a schematic diagram of an example circuit 400 illustrative of series switch fault detection. In the example of FIG. 4, the circuit 400 includes a grounded first AC power source 410. In some embodiments, the first AC power source 410 may be a high frequency AC power source. By high frequency it is meant a frequency greater than about 1 kilohertz (1 kHz). In some embodiments, the test signal exhibits a frequency of at least about 1 kilohertz (1 kHz), at least about 10 kilohertz (10 kHz), at least about 100 kilohertz (100 kHz), at least about 300 kilohertz (300 kHz), at least about 500 kilohertz (500 kHz), less than about 100 megahertz (100 MHz), less than about 10 megahertz (10 MHz), less than about 1 megahertz (1 MHz), and combinations thereof. In another embodiment, the first AC power source 410 may exhibit a frequency of at least 1 kilohertz (1 kHz), at least 3 kilohertz (3 kHz), at least 10 kilohertz (10 kHz), at least 40 kilohertz (40 kHz), at least 60 kilohertz (60 kHz), at least 100 kilohertz (100 kHz), at least 500 kilohertz (500 kHz), at least 1 gigahertz (1 GHz), and combinations thereof. A first resistor 420 is electrically connected in series with the first AC power source 410. A node A 430 is electrically connected in series to the first resistor 420. A first capacitor 440 is electrically connected in series to the node A 430. A node B 450 is connected in series with the first capacitor 440.

In the example of FIG. 4, a first inductor 460 is electrically connected to the node B 450. A node C 470 is electrically connected in series with the first inductor 460. A resistor 480 is electrically connected in series to the node C 470. A grounded second AC power source 490 is electrically connected to the resistor 480. In some embodiments, the second AC power source 490 may be a low frequency AC power source. By low frequency it is meant a frequency less than about 1 kilohertz (1 kHz). In some embodiments, the second AC power source 490 may exhibit a frequency of less than 1 kilohertz (1 kHz), less than 500 hertz (500 Hz), less than 100 hertz (100 Hz), less than 65 hertz (65 Hz), less than 60 hertz (60 Hz), less than 50 hertz (50 Hz), less than 40 hertz (40 Hz), and combinations thereof.

In the example of FIG. 4, a first series switch 500 is electrically connected to the node B 450. The first series switch 500 includes, includes a first relay 502 in parallel with a first series switch capacitor 504. A node F 510 is further electrically connected in series with the first series switch 500. A second series switch 520 is electrically connected in series with the node F 510. The second series switch 520 includes, a second relay 522 in parallel with a second series switch capacitor 524. A node D 530 is further electrically connected in series with the second series switch 520. A second inductor 540 is electrically connected to the node D 530. A node G 550 is electrically connected in series to the second inductor 540. A grounded resistor 560 is electrically connected in series with the node G 550. A second capacitor 570 is electrically connected to the node D 530. A node E 580 is electrically connected in series with the second capacitor 570. A grounded resistor 590 is electrically connected in series with the node E 580. At least one sensor (not shown) may be electrically connected to the circuit 400 and configured to measure a characteristic (e.g., voltage) at one or more of the nodes 430, 450, 510, 530, 550, and/or 580. In some embodiments, a capacitance of the first series switch capacitor 504 and a capacitance of the second series switch capacitor 524 are different.

In the example of FIG. 4, the first AC power source 410 provides a high frequency signal of about 500 kilohertz (500 kHz) and the second AC power source 490 provides a low frequency signal of about 50 hertz (50 Hz).

Figure 5:
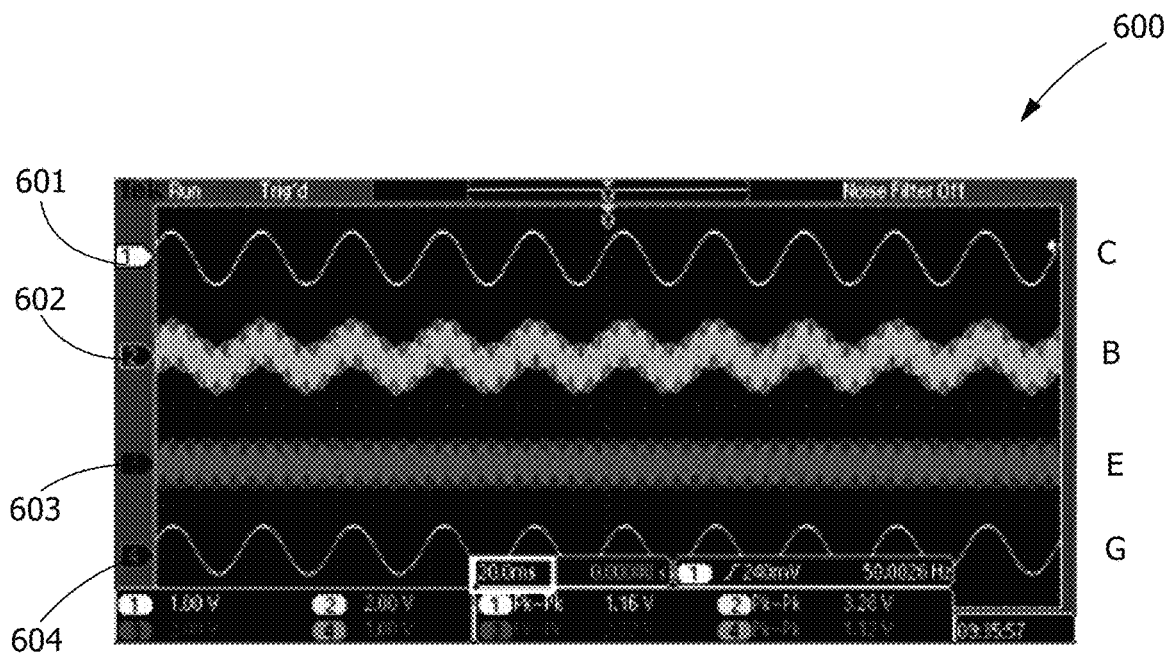
FIG. 5 is an image of a multi-channel oscilloscope display of measured characteristics of the circuit of FIG. 4, according to an embodiment.

FIG. 5 illustrates a sensor view 600 of data collected at various nodes of the circuit 400 with both the first relay 502 and the second relay 522 closed. Trace 1 601 is the waveform at node C 470. Trace 2 602 is the waveform at node B 450. Trace 3 603 is the waveform at node E 580. Trace 4 604 is the waveform at node G 550.

Figure 6:
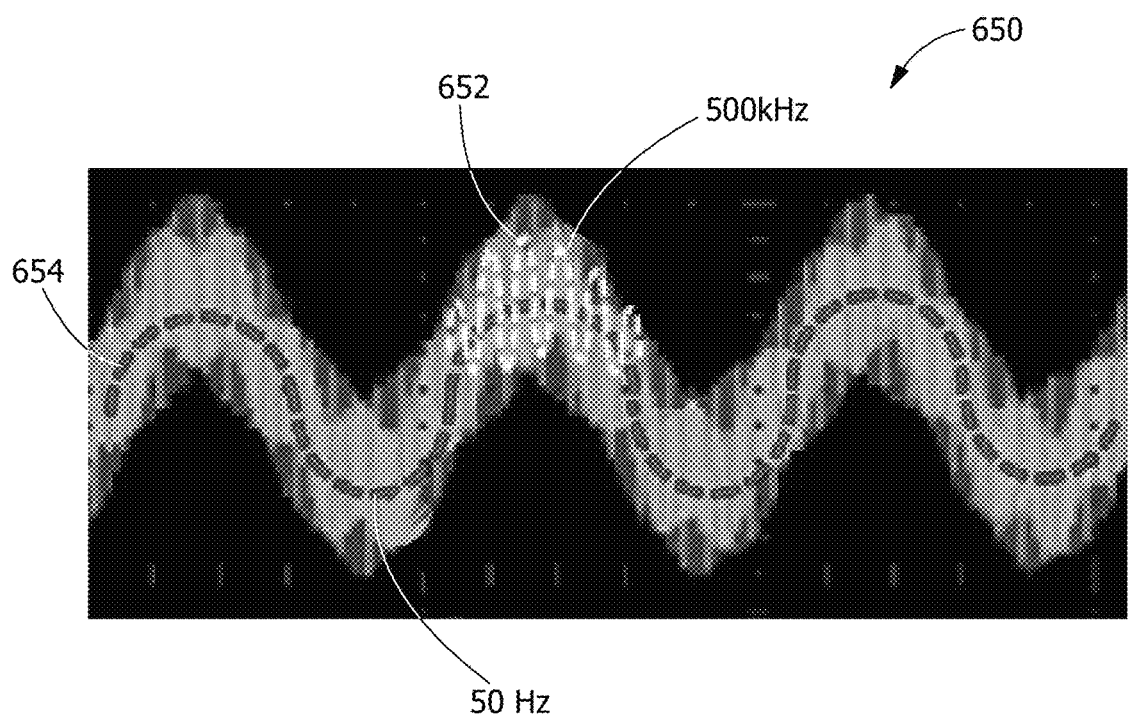
FIG. 6 is an expanded view of channel 2 of the oscilloscope display of FIG. 5, according to an embodiment.

FIG. 6, is an expanded sensor view 650 of the waveform measured at node B 450. The waveform of FIG. 6 illustrates the superposition of the 500 kHz signal 652 from the first AC power source 410 and the 50 Hz signal 654 from the second AC power source 490.

Figure 7:
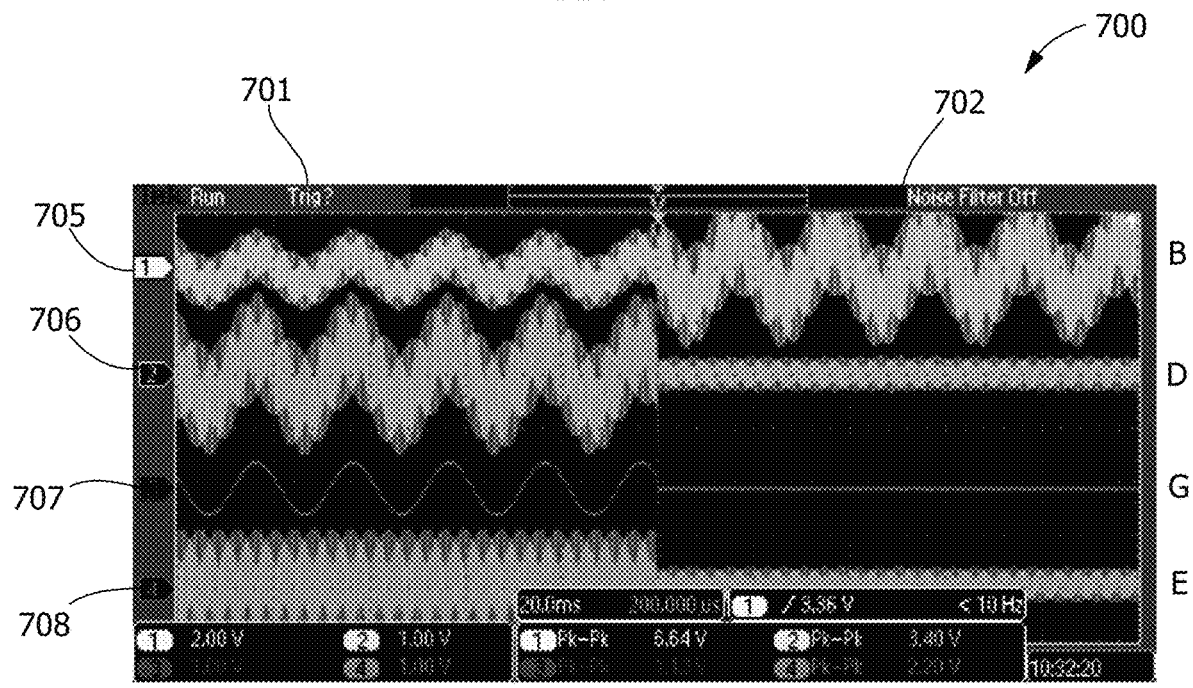
FIG. 7 is an image of a multi-channel oscilloscope display of measured characteristics of the circuit of FIG. 4, according to an embodiment.

If at least one of the first relay 502 or second relay 522 is opened, the path of the signals will include at least one of the first series switch capacitor 504 and/or second series switch capacitor 524. The inclusion of additional capacitance in the signal path may alter the impedance encountered by the signals. The impedance is dependent on the frequency of the signals. For example, a capacitor may act as a high pass filter. Thus, allowing a high frequency signal to pass substantially unattenuated. The same capacitor may substantially attenuate a low frequency signal. FIG. 7 illustrates a sensor view 700 including a left portion 701 corresponding to the waveforms with both relays 502, 522 closed. The sensor view 700 also includes a right portion 702 corresponding to the waveforms with the first relay 502 open and the second relay 522 closed. Trace 1 705 is the waveform at node B 450. Trace 2 706 is the waveform at node D 530. Trace 3 707 is the waveform at node G 550. Trace 4 708 is the waveform at node E 580. As seen in FIG. 7, the additional capacitance present when the first relay 502 is open, results in substantial attenuation of the signal.

As illustrated in FIG. 7, the waveforms generated by the first AC power source 410 and the second AC power source 490 encounter distinct impedances corresponding to the positions of the relays 502, 522. The distinct impedances result in distinct waveforms present at the various nodes of the circuit 400. In some embodiments, a user, such as a service technician, may view the waveforms to determine which of the relays is open and thus in need of repair or replacement. In some embodiments, the fault analysis module 190 may analyze the waveforms to determine which relay or relays is open and is potentially in need of repair or replacement. The fault analysis module 190 may additionally inform a user that one or more relays may need repair or replacement.

In an embodiment, fault determination may be performed in electrical systems having more than two series switches. Fault determination and identification may be performed in systems having at least 3 series switches, at least 5 series switches, at least 7 series switches, at least 10 series switches, at least 20 series switches, or more. In some embodiments, additional signal sources (e.g., AC power source) may be employed to provide additional complexity to the waveform for analysis. In some embodiments, at least 3 signal sources, at least 4 signal sources, at least 5 signal sources, or more may be employed. In some embodiments, the frequency of the signal sources may range from about 1 hertz (1 Hz) to at least 1 gigahertz (1 GHz), at least 2 gigahertz (2 GHz), at least 5 gigahertz (5 GHz), at least 10 gigahertz (10 GHz), or more. In some embodiments, the shape of the waveform may include sinusoidal, square, and/or sawtooth.

Figure 8:
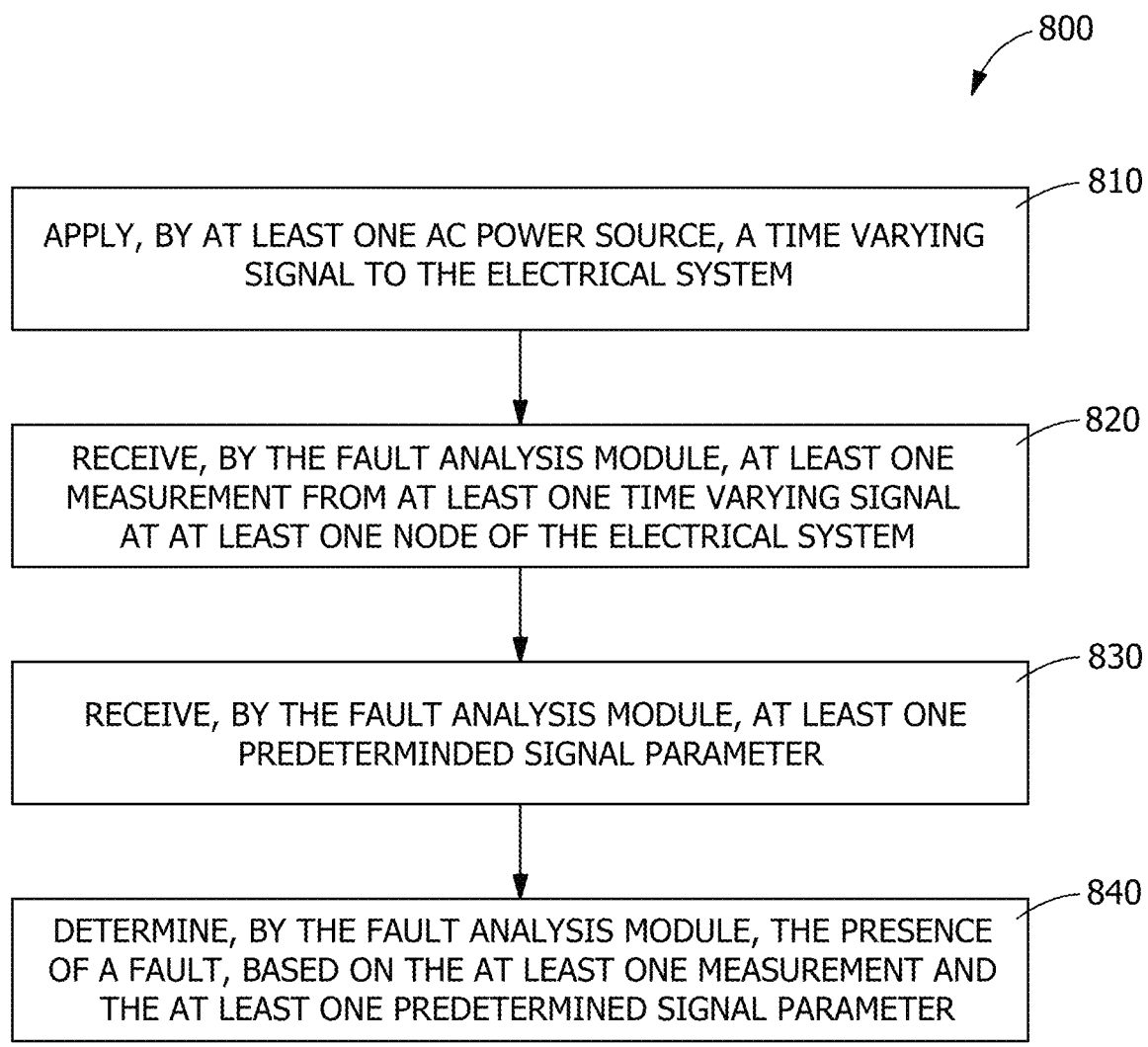
FIG. 8 is a flow chart of a fault detection method, according to an embodiment.

FIG. 8 is a flowchart 800 of a method of determining a failed switch in an electrical system. At block 810, the at least one AC power source applies at least one time varying signal to the electrical system. At block 820, the fault analysis module receives at least one measurement, from the at least one sensor, of the at least one time varying signal, at at least one node of the electrical system. At block 830, the fault analysis module receives at least one predetermined signal parameter. At block 840, the fault analysis module determines the presence of a fault, based on the at least one measurement and the at least one predetermined signal parameter.

While the invention has been described with reference to one or more embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. In addition, all numerical values identified in the detailed description shall be interpreted as though the precise and approximate values are both expressly identified.

We claim:

1. A method of determining a fault in at least one series switch of an electrical system, the electrical system including, at least one AC power source, at least one sensor, at least two series switches, and a fault analysis module including a processor and a memory, the method comprising:
    applying, by the at least one AC power source, at least one time varying signal to the electrical system;
    receiving, by the fault analysis module, at least one measurement from the at least one sensor of the at least one time varying signal at at least one node of the electrical system;
    receiving, by the fault analysis module, at least one predetermined signal parameter; and
    determining, by the fault analysis module, the presence of a fault, based on the at least one measurement and the at least one predetermined signal parameter.

2. The method of claim 1, wherein the at least one time varying signal includes at least two time varying signals.

3. The method of claim 1, wherein the at least one measurement includes at least two measurements.

4. The method of claim 3, wherein the at least two measurements are determined at, at least two nodes of the electrical system.

5. The method of claim 1, wherein the at least one measurement includes a voltage measurement.

6. The method of claim 1, wherein the predetermined signal parameter includes at least one voltage.

7. The method of claim 1, wherein the at least one time varying signal includes a first time varying signal having a frequency less than 1 kilohertz.

8. The method of claim 7, wherein the at least one time varying signal further includes a second time varying signal having a frequency greater than 1 kilohertz.

9. The method of claim 8, wherein the at least one time varying signal further includes a third varying signal having a frequency different from the first time varying signal and the second time varying signal.

10. The method of claim 1, further comprising notifying a user of the presence of a fault.

11. The method of claim 1, wherein the time varying signal includes a sinusoidal waveform, square waveform, or sawtooth waveform.

12. An series switch fault detection system, including at least two series switches, a processor and a memory containing instructions that when executed by the processor cause the system to:

apply, by at least one AC power source, at least one time varying signal to the system;

receive, by a fault analysis module, at least one measurement, from at least one sensor of the at least one time varying signal at at least one node of the electrical system;

receive, by the fault analysis module, at least one predetermined signal parameter; and determine, by the fault analysis module, the presence of a fault, based on the at least one measurement and the at least one predetermined signal parameter.

13. The system of claim 12, wherein the at least one time varying signal includes at least two time varying signals.

14. The system of claim 12, wherein the at least one time varying signal includes a first time varying signal having a frequency less than 1 kilohertz.

15. The system of claim 14, wherein the at least one time varying signal further includes a second time varying signal having a frequency greater than 1 kilohertz.

16. The system of claim 15, wherein the at least one time varying signal further includes a third varying signal having a frequency different from the first time varying signal and the second time varying signal.

17. The system of claim 12, wherein the at least one measurement includes at least two measurements.

18. The system of claim 17, wherein the at least two measurements are determined at, at least two nodes of the electrical system.

* * * * *